United States Patent
Dai et al.

(10) Patent No.: US 8,125,259 B2
(45) Date of Patent: Feb. 28, 2012

(54) DUTY CYCLE DISTORTION (DCD) JITTER MODELING, CALIBRATION AND GENERATION METHODS

(75) Inventors: Xingdong Dai, Bethlehem, PA (US); Weiwei Mao, Macungie, PA (US); Max J. Olsen, Mertztown, PA (US); Geoffrey Zhang, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 524 days.

(21) Appl. No.: 11/968,942

(22) Filed: Jan. 3, 2008

(65) Prior Publication Data
US 2009/0177457 A1   Jul. 9, 2009

(51) Int. Cl.
  *H03K 3/017* (2006.01)
(52) U.S. Cl. .................... 327/175; 375/375
(58) Field of Classification Search .......... 327/175; 375/375–376
  See application file for complete search history.

(56) References Cited

U.S. PATENT DOCUMENTS

| | | | | |
|---|---|---|---|---|
| 5,956,370 A * | 9/1999 | Ducaroir et al. | ............... | 375/221 |
| 6,084,452 A * | 7/2000 | Drost et al. | ............... | 327/175 |
| 6,670,838 B1 * | 12/2003 | Cao | ............... | 327/175 |
| 6,763,022 B1 * | 7/2004 | Brand et al. | ............... | 370/388 |
| 7,307,461 B2 * | 12/2007 | Nguyen et al. | ............... | 327/172 |
| 7,363,563 B1 * | 4/2008 | Hissen et al. | ............... | 714/733 |
| 2004/0012433 A1 * | 1/2004 | Kim et al. | ............... | 327/350 |
| 2004/0243899 A1 * | 12/2004 | Bonneau et al. | ............... | 714/733 |
| 2005/0108600 A1 * | 5/2005 | Arguelles | ............... | 714/701 |
| 2007/0024338 A1 * | 2/2007 | Shumarayev et al. | ............... | 327/175 |
| 2007/0159224 A1 * | 7/2007 | Dwarka et al. | ............... | 327/175 |
| 2007/0183552 A1 * | 8/2007 | Sanders et al. | ............... | 375/376 |
| 2009/0168941 A1 * | 7/2009 | Zhang et al. | ............... | 375/371 |

OTHER PUBLICATIONS

Sawyer et al., "Duty Cycle Distortion Penalty," IEEE802.3ap, http://grouper.ieee.org/groups/802/3/ap/public/channel_adhoc/sawyer_c1_0505.pdf (May 4, 2005).

* cited by examiner

*Primary Examiner* — Huy Vu
*Assistant Examiner* — Benjamin Lamont

(57) ABSTRACT

A method and system for modeling and calibrating duty cycle distortion (DCD) of a Serializer and Deserializer (SerDes) device, including first generating a clock DCD signal. Once the clock DCD signal is generated, it is calibrating based upon results obtained from a filtering process of the clock DCD signal. Once the clock DCD signal is calibrated, a data DCD signal is generated and calibrated based upon results obtained from a filtering process of the data DCD signal.

14 Claims, 3 Drawing Sheets

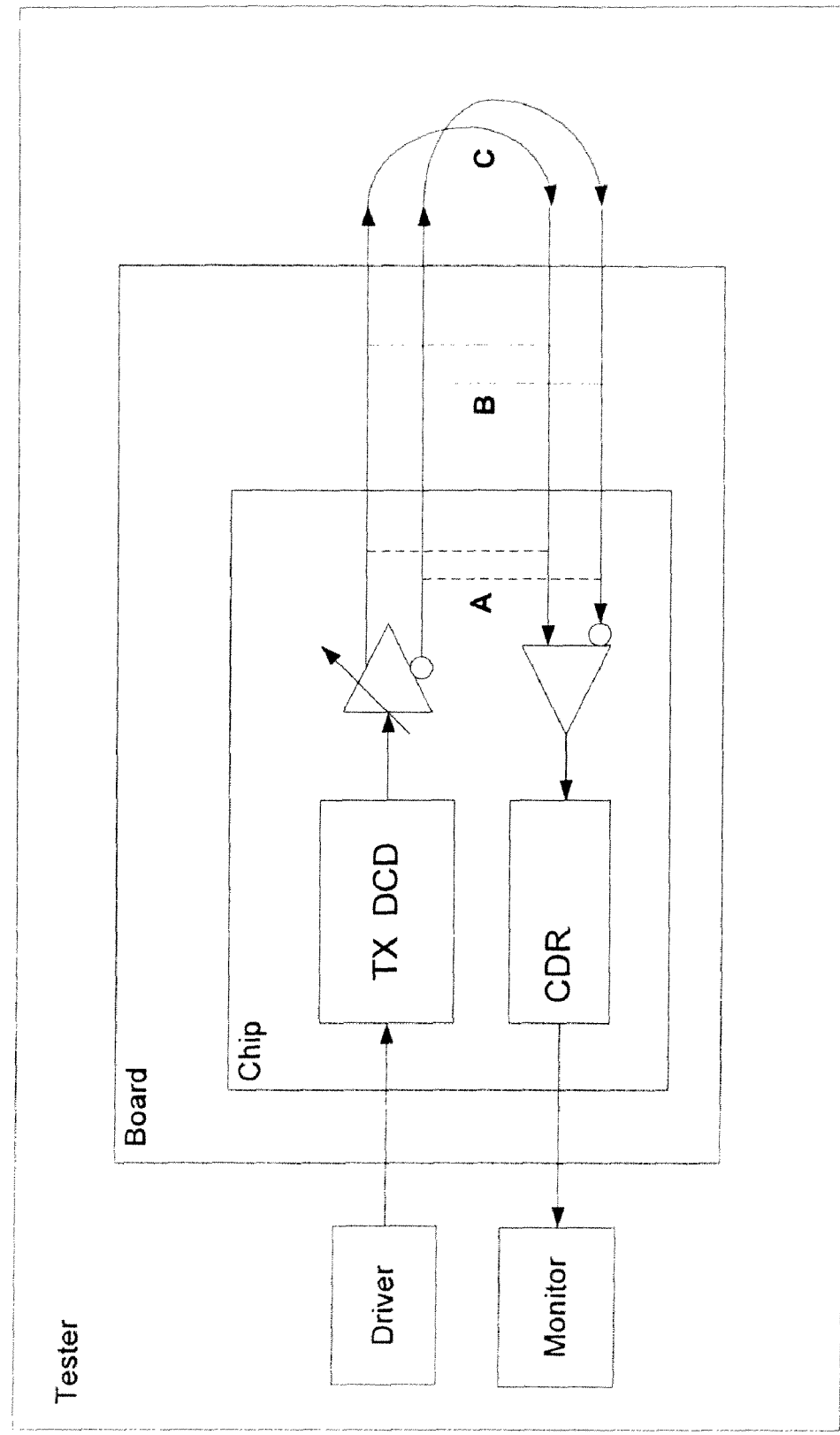

DUTY CYCLE DISTORTION (DCD) JITTER MODELING, CALIBRATION AND GENERATION METHODS

FIELD OF THE INVENTION

The invention pertains to transmission systems that use a Serializer and Deserializer (SerDes) circuits. More particularly, the invention pertains to a method and apparatus for modeling distortion on a transmitter and for testing a receiver of a SerDes circuit.

BACKGROUND OF THE INVENTION

A Serializer and Deserializer (SerDes) is an important building block in high speed computer networks and data communications systems. In applications that use a SerDes, no clock is included in the transmission of data signals. Instead, a receiver must extract the timing information from a received data signal and establish a data clock which is used to re-time the received data. The function of extracting the timing information is fulfilled by a clock data recovery (CDR) circuit.

Duty cycle distortion (DCD) is a dominant component of data dependent jitter (DDJ) for serializer and deserializer (SerDes) devices. Jitter is an unwanted variation of one or more signal characteristics in electronics and telecommunications. Jitter may be seen in characteristics such as the interval between successive pulses which results in a receiving CDR failing to accurately reproduce the timing information of a received signal. DDJ is a type of jitter whose effect is data pattern dependent.

DCD is one of the few jitter components that can be controlled to improve SerDes performance. The ability to accurately control DCD enables circuit designers to make better use of limited resources (area, power, simulation time, to name a few) to accomplish design objectives.

Previous attempts to control DCD have been limited to monitoring the DCD of a SerDes circuit, and perform phase adjustment on transmitted signals to reduce or eliminate any DCD present. Additionally, previous attempts have merely considered the DCD experienced in controlled testing environments rather than in multiple environments where temperature, voltage and process may vary to a great degree. Thus, the results of the previous attempts to control DCD are difficult to quantify in a real world environment and are of limited usage to an end user of the SerDes circuit.

What is needed is a way to model DCD over a wide range of control variables and calibrate a SerDes circuit accordingly such that the SerDes circuits efficiency is maximized.

SUMMARY OF THE INVENTION

This present invention is a method and system for accurately modeling duty cycle distortion (DCD). Based upon this modeling, precise calibration methods for serializer and deserializer (SerDes) circuits can be determined and implemented. The present invention is incorporated as a member of build-in-self-test (BIST) methods to stress a receiver with horizontal timing variations (jitter), exercise the receiver clock data recovery circuit (CDR) at speed, and provide additional functional and performance coverage of a SerDes circuit. Carefully calibrated, the circuit will approximate certain effects (such as pulse width shrinkage) of an actual optical subsystem where multimode fiber (MMF) interconnects and optical amplifier, coupler, and repeater are deployed.

A first embodiment of the present invention is a method of modeling and calibrating duty cycle distortion (DCD) of a SerDes device, the method comprising the steps of first generating a clock DCD signal. Once the clock DCD signal is generated, it is calibrated based upon results obtained from a filtering process of the clock DCD signal. Once the clock DCD signal is calibrated, a data DCD signal is generated and calibrated based upon results obtained from a filtering process of the data DCD signal.

BRIEF DESCRIPTION OF THE FIGURES

FIG. 3 illustrates a testing circuit according to principles of the present invention.

DETAILED DESCRIPTION OF THE INVENTION

In a Serializer and Deserializer (SerDes) device such as a serial data communication device (e.g., a receiver), total jitter (TJ) is a specified variable on serial link standards. TJ is an often used figure of merit when comparing different SerDes devices. TJ is composed of random jitter (RJ) and deterministic jitter (DJ). Unlike Gaussian-distributed RJ which is unbounded in amplitude, DJ is bounded. DJ can be further divided into periodic jitter (PJ), inter-symbol interference (ISI), and duty cycle distortion (DCD). PJ often arises from crosstalk within the system, such as power supply noise coupling. ISI and DCD are sometimes lumped together and called data dependent jitter (DDJ). ISI is commonly introduced by the bandwidth limited physical media, through which a SerDes device is connected. DCD on the other hand, is often generated within a SerDes device itself. The sources of DCD often point to deficiencies in the design. Therefore correct identification and modeling of DCD is important to the development of SerDes and to the overall performance of serial data communications systems.

In addition, unlike passive backplane or copper cable in an electric system, fiber optic network contains active components such as optical amplifier, coupler, and repeater. These active components can and will contribute certain amount of DCD to the overall system jitter. Therefore for fiber optic system development, there is a need to model this external DCD jitter component on chip using precision calibration and generation methods.

DCD jitter is caused primarily by an imbalance in the drive circuit bias levels such as transistor threshold voltage, and by the asymmetry of rising and falling edge speeds. For the transmitter, serial data sequences are clocked and buffered before making contact with physical interconnects. Therefore both transmit clock and a given pattern of the serial data contribute to the DCD jitter. The DCD component from a clock source is referred to as "clock DCD" and that from a data source "data DCD". Clock DCD is mainly attributed to the asymmetry of clock duty cycles. In case of multi-phased clock, clock DCD arises when the phase separation or spacing is not linear. Clock DCD jitter is passed on to the serial data when these distorted clocks are used to serialize the parallel input signal. Serialized data often have to go through some transformations or waveform shaping, before they are put onto the physical media. Common last stage data buffers include current mode logic (CML) buffer, low voltage differential signaling (LVDS) buffer, etc. These data buffers, if un-calibrated, will have different rise and fall slew rates. The difference between rising and falling edges, contributes directly to the data DCD jitter. Therefore to fully control DCD jitter, both clock DCD and data DCD are modeled and calibrated.

Figure 1:
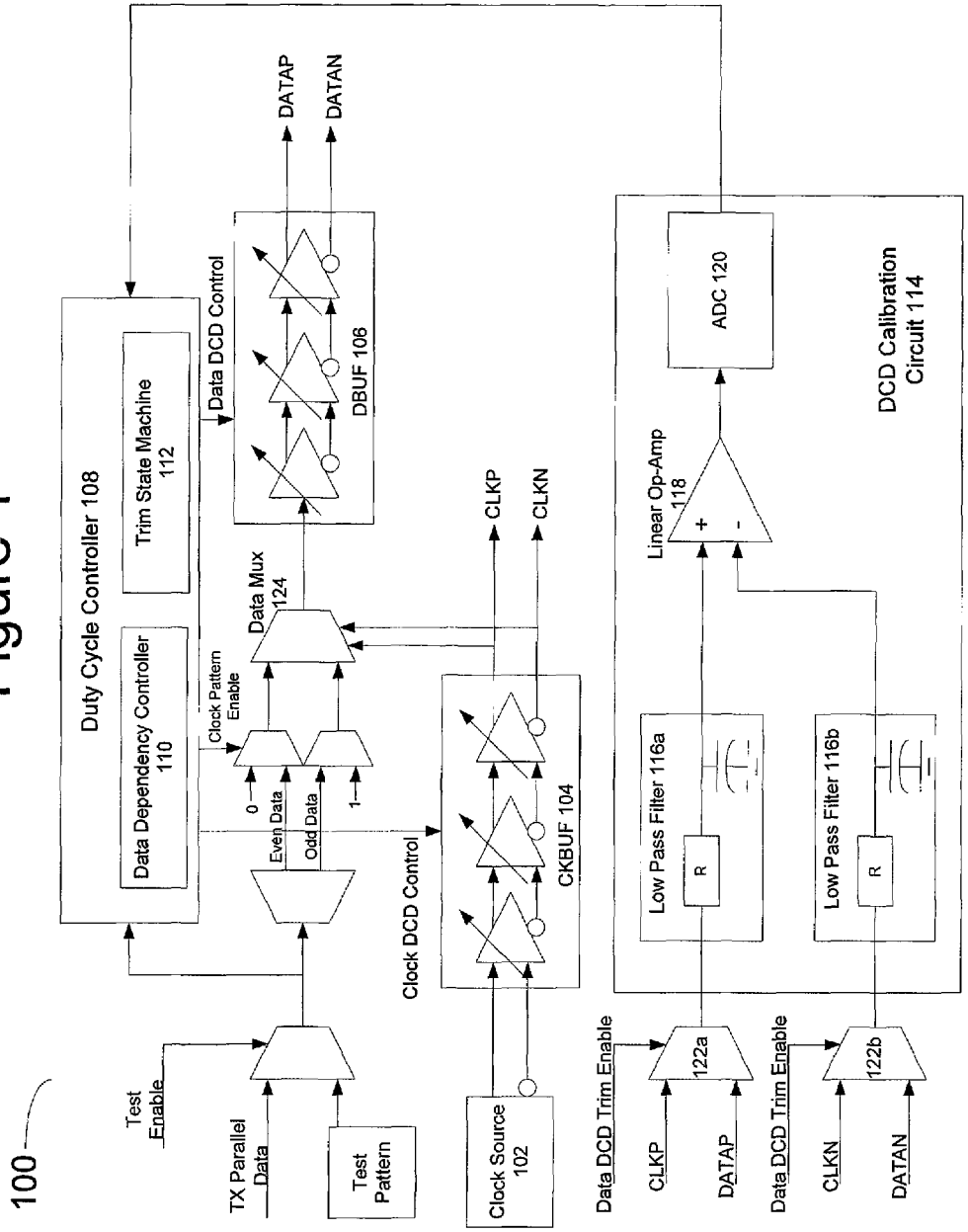
FIG. 1 illustrates a DCD model circuit according to principles of a first embodiment of the present invention.

FIG. 1 illustrates a DCD modeling circuit 100 according to principles of a first embodiment of the present invention. DCD modeling circuit 100 includes clock source 102, a programmable threshold (delay) clock buffer module (CKBUF) 104, a programmable threshold (slew rate) data buffer module (DBUF) 106, and duty cycle controller (DCD) 108. DCD 108 includes data dependency controller (DDC) 110 as well as trim state machine 112. DDC 110 scans past, current, and future signal bits and determines the appropriate threshold settings for CKBUF 104 and DBUF 106.

The DCD calibration circuit 114 includes multiple low pass filters 116a and 116b, a linear op-amp 118, and an analog-to-digital converter (ADC) 120. Though differential clock and data buffers are shown, the circuits can be easily extended to single-ended clock and data buffers as well as multi-phase multi-data designs. Since clock and data are two different sources of DCD jitter, they are calibrated separately. To reduce overall test overheads, it is highly desirable that the test circuit have a small footprint. In DCD modeling circuit 100, the calibration circuit 114 is shared between the clock DCD and the data DCD.

Clock DCD jitter is calibrated by correlating ADC 120 outputs with different DDC controls to the CKBUF 104. This correlation table is the calibrated DCD jitter due to clock phase differences. It is worth mentioning that clock DCD is data pattern independent. If CKBUF 104 consists of more than one clock buffer as shown in FIG. 1, each individual clock buffer can have independent control signals or share common control signals from DDC. To calibrate the clock DCD, DDC outputs control signals which change the threshold voltage of clock buffers. This variation of threshold voltage affects the clock signal rising and falling edge positions, and is reflected in the clock duty cycle. Data DCD trim enable signal is set to a logic 0, which selects the clock phase signals (CLKP and CLKN) at multiplexers 122a and 122b. Each clock phase signal passes through a matching low pass filter, e.g., 116a and 116b respectively. This filter can be made as simple as an RC low pass filter. The DC component of clock phase signals are then compared and linearly amplified by linear op-amp 118. The result is then fed to ADC 120. The digital outputs from ADC 120 are then correlated with DDC 110 controls signals. For example, when ADC 120 output is zero, clock duty cycle is fully balanced and the corresponding DDC 110 control signal is recorded as having zero clock DCD. When ADC 120 output is positive, positive clock phase has longer duration than negative phase.

As clock DCD also affects the serial data path, clock DCD must be first calibrated and turned off before data DCD can be calibrated. In addition, to achieve minimal test overheads, it is highly desirable to reuse the calibration circuit in place. To reach that goal, a clock data pattern, either from an external source (TX parallel data) or internal sources (either built-in test pattern generator or fixed logic insertion points), is used to drive the transmitter. Because the TX parallel data pattern is alternating 1s and 0s, the same calibration circuit and procedure for clock DCD can be re-used for data DCD calibration purpose. This time, ADC 120 outputs are correlated with different DDC 110 control signals to DBUF 106. These signals control data buffer slew rates. If DBUF 106 consists of more than one data buffer, each individual data buffer can have independent control signals or share common control signals from DDC 110. For example, data DCD controls are first set to generate a balanced data duty cycle. Data pattern can be sourced from externally from TX parallel data, or on-chip built-in test pattern, or enable clock pattern enable to set force all even data one logic value, and the odd data the opposite value. The output of data multiplexer 124 is a clock pattern, which goes to the programmable slew rate data buffers (DBUF 106). The outputs of DBUF 106 are tapped and selected by setting data DCD trim enable to a logic 1 at multiplexers 122a and 122b. Data signals go through a set of matching low pass filters 116a and 116b, compared and amplified by linear op-amp 118, and then digitized by ADC 120. The digital outputs are then correlated with data DDC 110 control signals as it was done for clock DCD.

Once both clock DCD and data DCD are calibrated, complex and controlled DCD jitter can be generated to validate system performance and receiver logic. This testing procedure is fully self-contained.

Figure 2:
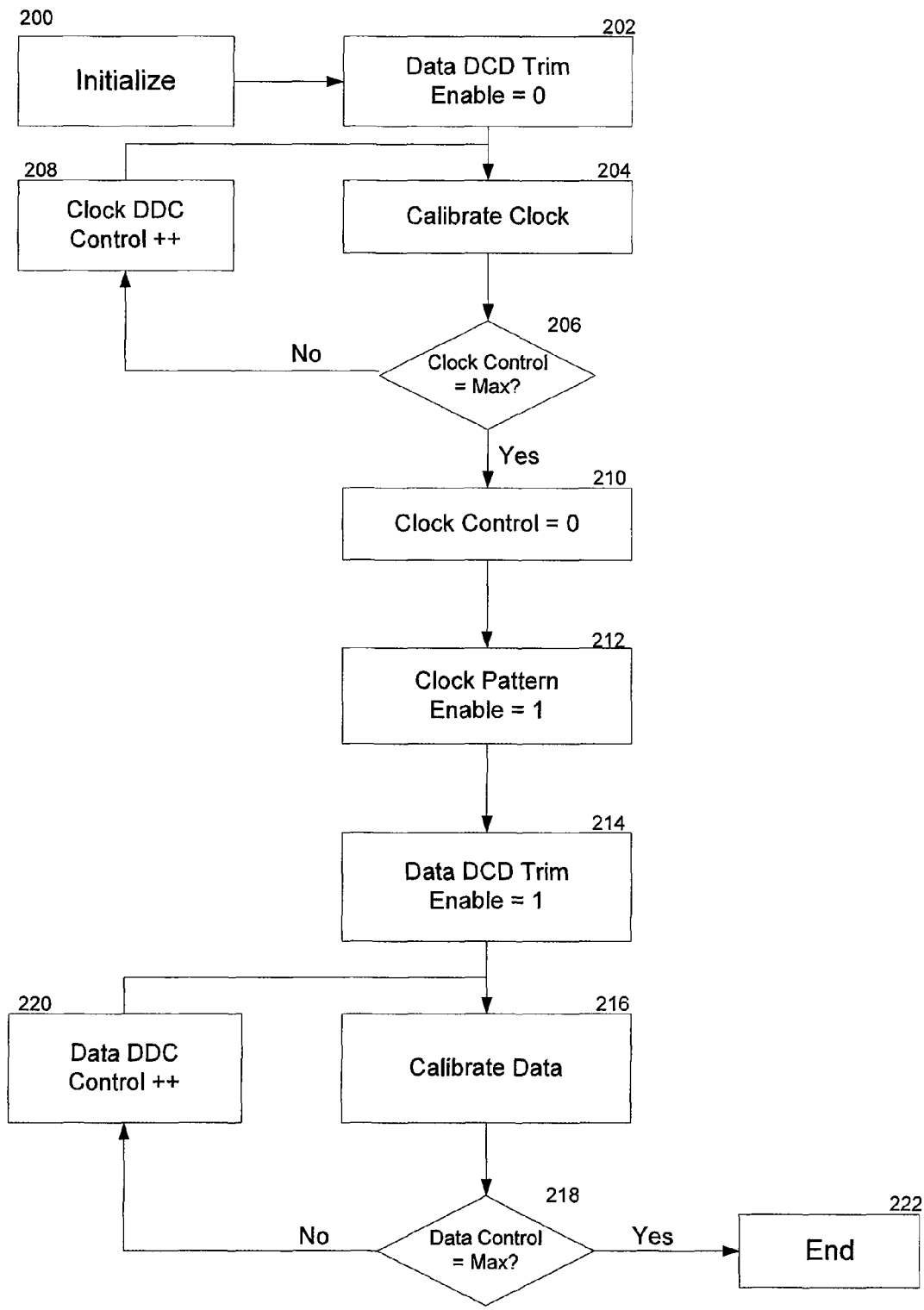
FIG. 2 illustrates a flow diagram of a calibration process of a SerDes circuit according to principles of the present invention.

FIG. 2 is a flow diagram illustrating the steps followed during a calibration process of a SerDes device. The process begins at step 200 where the DDC control signals for both the clock and the data are initialized. Once the signals are initialized, the process proceeds to step 202.

At step 202, the data DCD trim enable signals are set to zero which allows the clock signals (CLKP and CLKN) to pass to the DCD calibration circuit 114. Once the clock signals are passed to the calibration circuit, the process proceeds to step 204 where the clock signals are calibrated. As described with respect to FIG. 1, the output of ADC is passed to DCC 108.

Once the output of ADC 120 is passed to DCC 108, the process moves to decision step 206. Here, the output of ADC 120 is compared with the present value of the clock DCD control signal. If the clock DCD control signal equals the maximum value outputted by ADC 120, then the clock is calibrated and the process proceeds to step 210. If the clock DCD control signal does not equal the maximum value outputted by ADC 120, the process proceeds to step 208.

At step 208, the value of the clock DCD control signal is incremented. Then the process returns to step 204. Steps 204-208 are repeated until the clock DCD control signal is equal to the maximum output value of ADC 120.

Once the clock is calibrated, the process moves to step 210. Here, the clock DCD control signal is set to zero and a balanced clock duty cycle is forced. This step effectively terminates the clock calibration portion of the process. The process then moves to step 212. Here, the clock pattern enable signal is set to one which starts the data calibration portion of the process.

Once the clock pattern enable signal is set to one, the process proceeds to step 214. Here, data DCD trim enable is set to one which allows the data signals (DATAP and DATAN) to pass to the DCD calibration circuit 114. Once the clock signals are passed to the calibration circuit, the process proceeds to step 216 where the data signals are calibrated. As described with respect to FIG. 1, the output of ADC is passed to DCC 108.

Once the output of ADC 120 is passed to DCC 108, the process moves to decision step 218. Here, the output of ADC 120 is compared with the present value of the data DCD control signal. If the data DCD control signal equals the maximum value outputted by ADC 120, then the data receive circuitry is calibrated and the process proceeds to step 222. If the data DCD control signal does not equal the maximum value outputted by ADC 120, the process proceeds to step 220.

At step 220, the value of the data DCD control signal is incremented. Then the process returns to step 216. Steps 216-220 are repeated until the data DCD control signal is equal to the maximum output value of ADC 120. Once the data DCD control signal is equal to the maximum output value of ADC 120, the data receiving circuitry is calibrated and the process moves to step 222. At step 222, the calibration circuit is disabled and the process ends.

With a transmitter equipped with a calibrated DCD generator such as the one described in FIG. 1, ATE validations of the CDR circuit can be achieved. These tests can be implemented as internal (on-chip) and external (on board or on tester) loop back from transmitter to receiver. As such the validation methods described are fully self-contained and can lower overall test cost. FIG. 3 illustrates an example of an on-chip, on-board, or on-tester loopback circuit for incorporating the testing procedure of the present invention. Feedback loop A is the on-chip loopback, feedback loop B is the on-board loopback, and feedback loop C is the on-tester loopback. Horizontal timing variations allow the CDR circuit to be more thoroughly and exhaustively tested, thus minimizing the chances of defected devices being shipped to customers and getting deployed in the field. Thus the described circuits and method can help avoid costly recall, and more importantly continuously support company's reputation and mission statement to deliver the most reliable devices.

Additionally, while one goal of the present invention is to eliminate unnecessary circuitry from the testing circuit, it should be realized that additional circuitry could be added and would be obvious to one of ordinary skill in the art. For example, a second calibration circuit could be included allowing for the calibration of the data DCD and the clock DCD simultaneously as opposed to the single calibration circuit embodiment illustrated herein.

Additional alterations, modifications, and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

The invention claimed is:

1. A method of modeling and calibrating duty cycle distortion (DCD) of a Serializer and Deserializer (SerDes) device, the method comprising the steps of:
   generating a clock DCD signal, wherein said clock DCD signal controls a duty cycle distortion of a differential clock signal;
   calibrating said clock DCD signal based upon results from filtering said differential clock signal;
   generating a data DCD signal, wherein said data DCD signal controls a duty cycle distortion of a differential data signal; and
   calibrating said data DCD signal based upon results from filtering said differential data signal.

2. The method of claim 1, further comprising the step of:
   combining said calibrated clock DCD signal and said data DCD signal into a combined DCD signal.

3. The method of claim 2, further comprising the step of:
   calibrating said SerDes device by monitoring said SerDes device's response to said combined DCD signal.

4. The method of claim 3, wherein said calibrating said SerDes device is incorporated into a set of automatic tests for said SerDes device.

5. The method of claim 4, wherein said set of automatic tests are performed via an on-board, on-chip, or on-tester testing circuit.

6. The method of claim 1 wherein said two calibration steps are performed independently of each other.

7. The method of claim 1, wherein said SerDes device is a serial data communication device.

8. An apparatus for modeling and calibrating duty cycle distortion (DCD) of a Serializer and Deserializer (SerDes) device, the apparatus comprising:
   a clock source for generating a clock DCD signal, wherein said clock DCD signal controls a duty cycle distortion of a differential clock signal;
   a data source for generating a data DCD signal, wherein said data DCD signal controls a duty cycle distortion of a differential data signal; and
   a calibration circuit for calibrating both said clock DCD signal based upon results from filtering said differential clock signal and calibrating said data DCD signal based upon results from filtering said differential data signal.

9. The apparatus of claim 8, further comprising:
   a combiner for combining said calibrated clock DCD signal and said data DCD signal into a combined DCD signal.

10. The apparatus of claim 9, further comprising:
    a controller for calibrating said SerDes device by monitoring said SerDes device's response to said combined DCD signal.

11. The apparatus of claim 10, wherein said apparatus performs said calibrating said SerDes device in a set of automatic tests for said SerDes device.

12. The apparatus of claim 11, wherein said set of automatic tests are performed via an on-board, on-chip, or on-tester testing circuit.

13. The apparatus of claim 8 wherein said calibration circuit performs calibrating said clock DCD signal and said calibrating said data DCD signal independently of each other.

14. The apparatus of claim 8, wherein said SerDes device is a serial data communication device.

* * * * *